United States Patent
Casper et al.

(10) Patent No.: US 7,120,838 B2
(45) Date of Patent: Oct. 10, 2006

(54) METHOD AND UNIT FOR DESKEWING SIGNALS

(75) Inventors: Bryan K. Casper, Hillsboro, OR (US); Stephen R. Mooney, Beaverton, OR (US); Aaron K. Martin, Hillsboro, OR (US); Joseph T. Kennedy, Beaverton, OR (US); Matthew B. Haycock, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 463 days.

(21) Appl. No.: 10/106,636

(22) Filed: Mar. 26, 2002

(65) Prior Publication Data

US 2003/0188234 A1      Oct. 2, 2003

(51) Int. Cl.
  *G11B 5/00*      (2006.01)
  *G11B 20/00*     (2006.01)
  *G06K 5/04*      (2006.01)

(52) U.S. Cl. .................................. 714/700
(58) Field of Classification Search ............... 714/718, 714/724, 700, 701, 704, 707; 324/76.77, 324/76.58; 327/158; 365/194, 233; 713/401
See application file for complete search history.

(56) References Cited

U.S. PATENT DOCUMENTS

| | | | |
|---|---|---|---|
| 4,740,996 A * | 4/1988 | Somer | 375/318 |
| 5,489,864 A | 2/1996 | Ashuri | 327/161 |
| 6,075,832 A | 6/2000 | Geannopoulos et al. | 375/375 |
| 6,209,072 B1 | 3/2001 | MacWilliams et al. | 711/167 |
| 6,263,034 B1 * | 7/2001 | Kanack et al. | 375/371 |
| 6,522,122 B1 * | 2/2003 | Watanabe et al. | 324/76.77 |
| 6,528,982 B1 * | 3/2003 | Yanagisawa et al. | 324/76.77 |

OTHER PUBLICATIONS

Sidiropoulos, Stefanos.,et al. ,"A Semidigital Dual Delay-Locked Loop", *IEEE Journal of Solid-State Circuits*, vol. 32, (Nov. 1997),1683-1692.

Tanahashi, Toshio.,et al., "A 2Gb/s 21CH Low-Latency Transceiver Circuit for Inter-Processor Communication", *2001 IEEE International Solid-State Circuits Conference*, (Feb. 2001),3 pgs.

\* cited by examiner

*Primary Examiner*—James C. Kerveros
(74) *Attorney, Agent, or Firm*—Schwegman, Lundberg, Woessner & Kluth, P.A.

(57) ABSTRACT

A clock deskew method includes receiving a data signal and a clock signal, processing the data signal to generate a jitter characterization parameter, shifting the clock signal by about 90° from the jitter characterization parameter to generate a sampling clock signal, and sampling the data signal with the sampling clock signal to generate a deskewed data signal. A clock deskew unit includes a clock unit, a sampling unit, and a deskew unit. The deskew unit includes a jitter characterization unit that generates a jitter characterization parameter. The jitter characterization parameter establishes a phase location for aligning a clock signal. Shifting the clock signal by about 90° from the phase location of the jitter characterization parameter provides a location for sampling a data signal to generate a deskewed data signal.

20 Claims, 4 Drawing Sheets

METHOD AND UNIT FOR DESKEWING SIGNALS

FIELD

This invention relates to deskewing signals in electronic systems.

BACKGROUND

Data rates in electronic systems in general and digital systems in particular continue to increase. High data rates leave little margin for error in aligning clock signals to data signals. Alignment errors between clock signals and data signals increase the bit-error-rate (BER) in a system. Systems that have high BERs sometimes retransmit bits that are in error. Unfortunately, the retransmission of bits reduces a system's effective bandwidth.

Skew is any unintended alignment error between signals in a system. Skew has many different sources. For example, mismatches between the lengths of transmission lines that carry clock signals and the lengths of transmission lines that carry data signals can cause skew between the clock signals and the data signals. In another example, mismatched turn-on and turn-off times between the circuits that drive clock signals and the circuits that drive data signals can cause skew between the clock signals and the data signals. Finally, a voltage fluctuation on a bus that supplies power to circuits that generate clock signals or data signals can cause skew between the clock signals and the data signals.

Controlling skew sources is one method of reducing skew between clock signals and data signals. For example, transmission line lengths can be measured and trimmed to match transmission line lengths for clock signals to transmission line lengths for data signals. Circuits that drive clock signals and circuits that drive data signals can be individually selected to have substantially identical electrical properties. Finally, power supply voltages can be filtered and controlled to reduce or eliminate power supply fluctuations. Unfortunately, controlling skew sources is an unsatisfactory method for reducing skew because it is both difficult and expensive.

For these and other reasons there is a need for the present invention.

DESCRIPTION

Figure 1A:
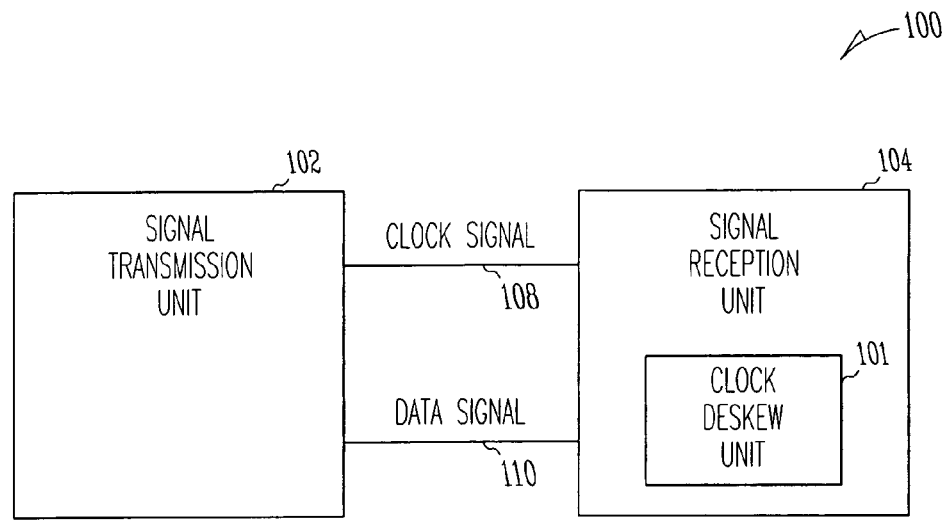
FIG. 1A shows a block diagram of one embodiment of a signaling unit including a clock deskew unit.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A shows a block diagram of one embodiment of a signaling unit 100 including a clock deskew unit 101. The signaling unit 100 is an electronic system or circuit that includes a signal transmission unit 102 coupled to a signal reception unit 104. The signal reception unit 104 includes the clock deskew unit 101.

The signal transmission unit 102 is an electronic system or circuit that generates a clock signal 108 and a data signal 110. (Those skilled in the art will appreciate that the present invention is not limited to use in connection with a single clock signal 108 and a single data signal 110. The description herein refers to the clock signal 108 in the singular and the data signal 110 in the singular only to simplify the description.) The signal transmission unit 102 is not limited to a particular type of signal transmission unit. Any electronic system or circuit that transmits a clock signal and a data signal is suitable for use in connection with the present invention. In one embodiment, the signal transmission unit 102 is a processor, such as a complex-instruction set computer system (CICS) processor, a reduced instruction-set computer (RISC) processor, a very-long-instruction-word (VLIW) processor, or a digital signal processor (DSP). In an alternative embodiment, the signal transmission unit 102 is an application specific integrated circuit (ASIC) or other electronic logic system or circuit designed for an application in a particular industry, such as the automotive industry, the aerospace industry, or the communications industry. Exemplary ASICs suitable for use in connection with the present invention include ASICs designed for engine control, geo-positioning, and network routing.

The signal reception unit 104 is an electronic system or circuit that receives the clock signal 108 and the data signal 110. The signal reception unit 104 is not limited to a particular type of signal reception unit. Any electronic system or circuit that receives a clock signal and a data signal is suitable for use in connection with the present invention. In one embodiment, the signal reception unit 104 is a processor, such as a CICS processor, a RISC processor, a VLIW processor, or a DSP. In an alternative embodiment, the signal reception unit 104 is an ASIC or other electronic logic system or circuit designed for an application in a particular industry, such as the automotive industry, the aerospace industry or the communications industry. Exemplary ASICs suitable for use in connection with the present invention include ASICs designed for engine control, geo-positioning, and network routing.

Figure 3A:
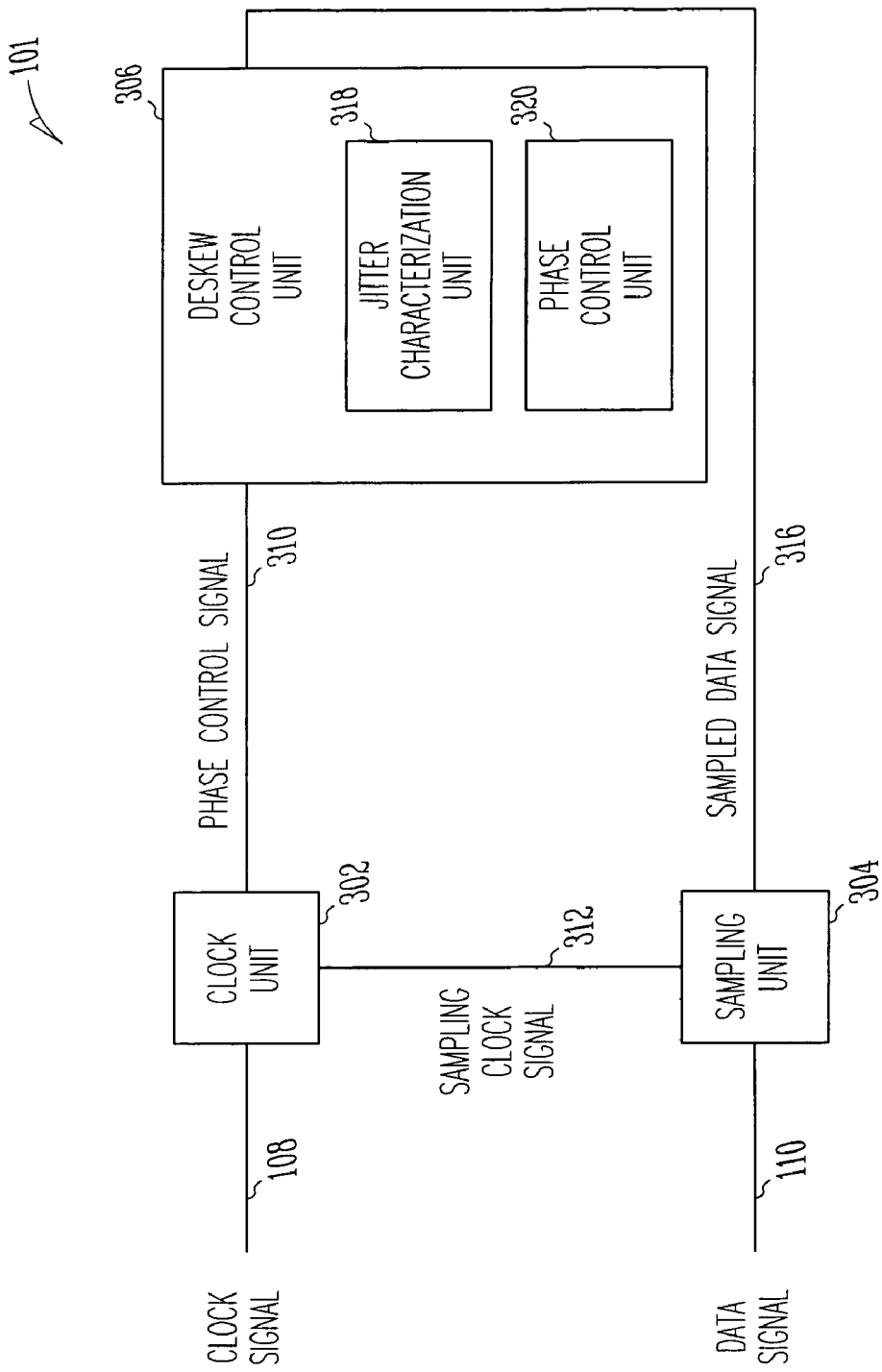
FIG. 3A shows a block diagram of one embodiment of the clock deskew unit shown in FIG. 1A including a deskew control unit having a jitter characterization unit and a phase control unit.
Figure 3C:
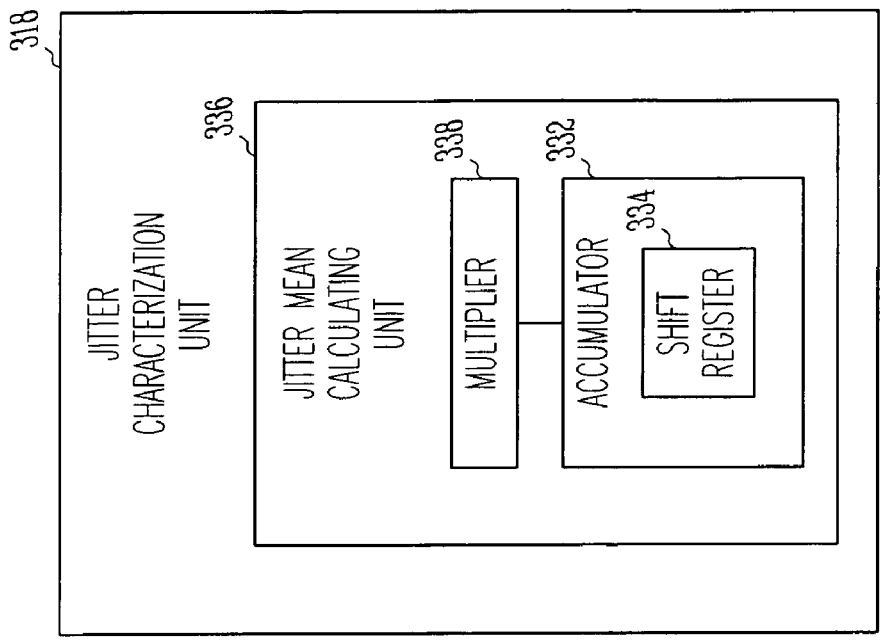
FIG. 3C shows a detailed block diagram of an alternative embodiment of the jitter characterization unit shown in FIG. 3A including a jitter mean calculating unit.
Figure 3B:
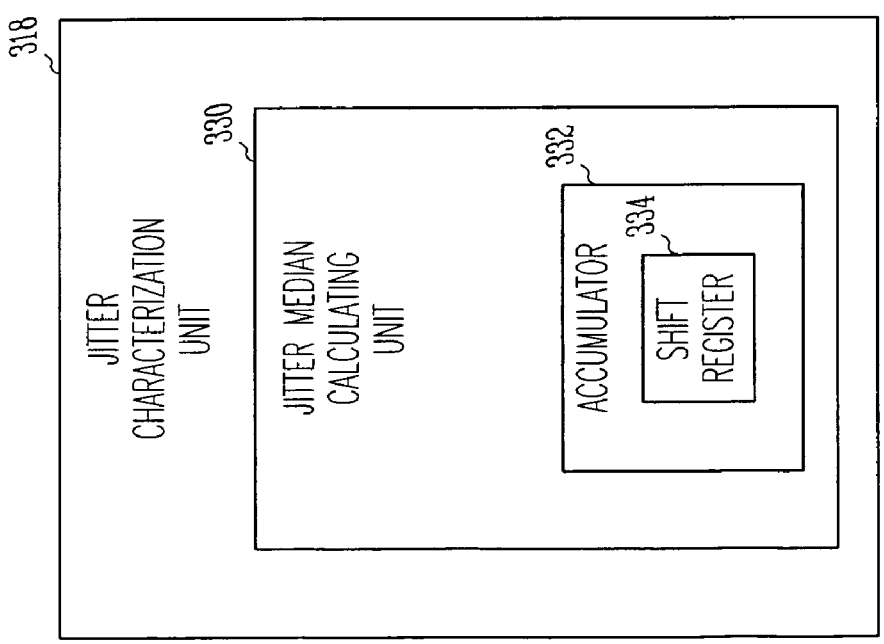
FIG. 3B shows a detailed block diagram of one embodiment of the jitter characterization unit shown in FIG. 3A including a jitter median calculating unit.

The clock deskew unit 101 deskews the clock signal 108 with respect to the data signal 110 by properly aligning the clock signal 108 to the data signal 110. To properly align the clock signal 108 to the data signal 110, substantially center each sampling transition of the clock signal 108 within a bit-cell of the data signal 110. Alternatively, to properly align the clock signal 108 to the data signal 110, position each sampling transition of the clock signal 108 within a bit-cell of the data signal 110 to achieve a low bit-error rate. The clock deskew unit 101 is described in greater detail in the description of FIGS. 3A–3C provided below.

Figure 1B:
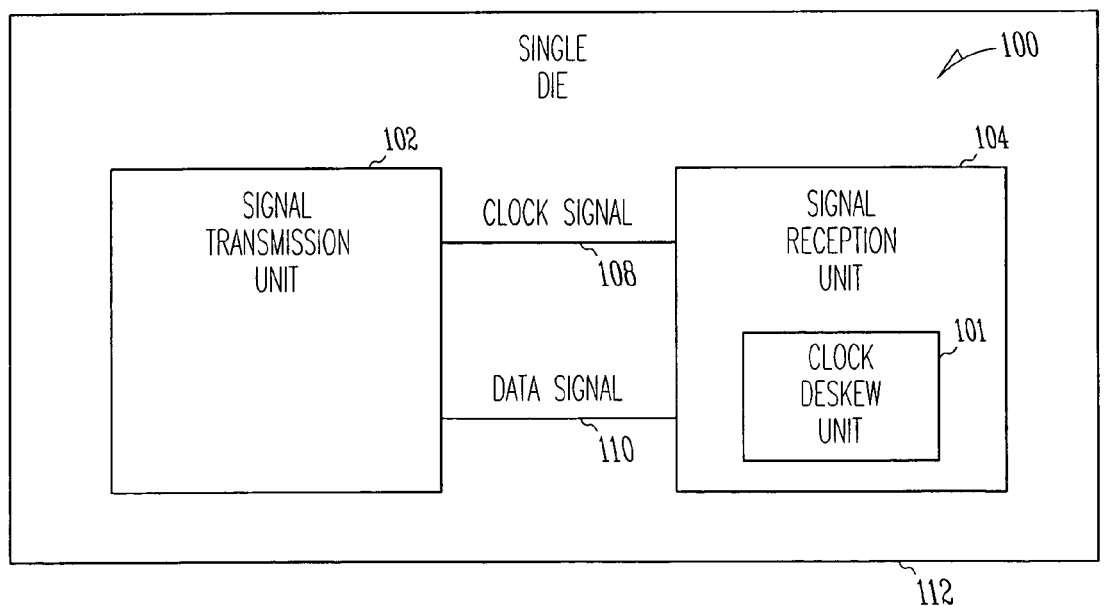
FIG. 1B shows a block diagram of one embodiment of the signaling unit shown in FIG. 1A formed on a single die.

FIG. 1B shows a block diagram of one embodiment of the signaling unit 100 shown in FIG. 1A formed on a single die 112. The present invention is not limited to use in connection with a particular packaging configuration. Deskewing the clock signal 108 with respect to the data signal 110 is useful in packaging configurations in which the signal transmission unit 102 and the signal reception unit 104 are formed on the single die 112.

Figure 1C:
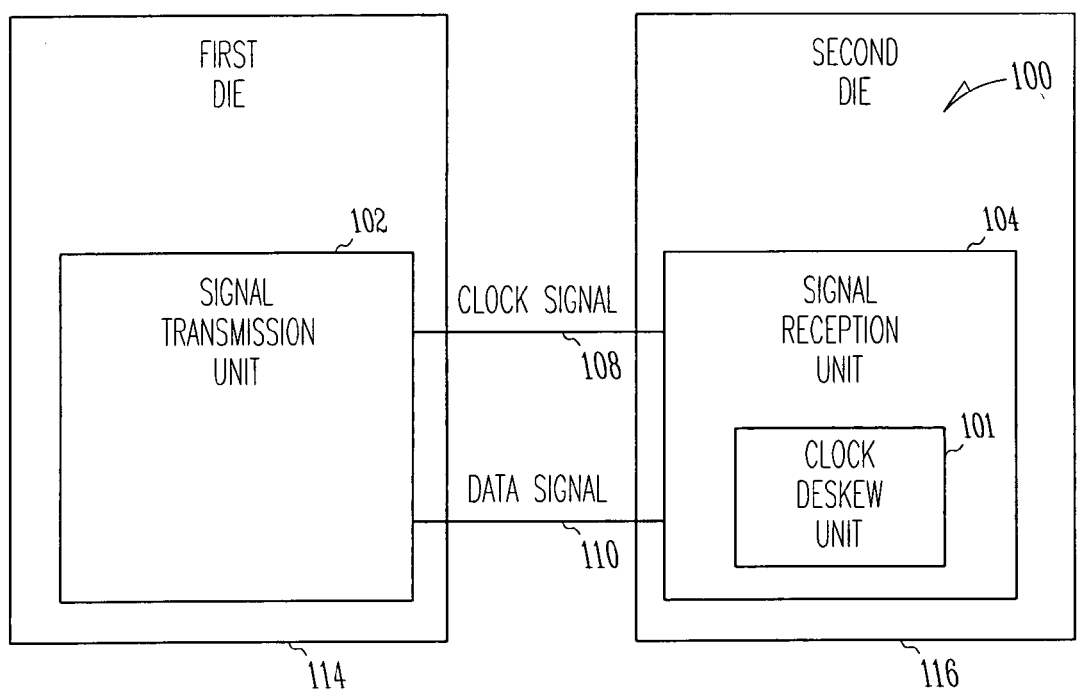
FIG. 1C shows a block diagram of one embodiment of the signaling unit shown in FIG. 1A formed on a first die and a second die.

FIG. 1C shows a block diagram of one embodiment of the signaling unit 100 shown in FIG. 1A formed on a first die 114 and a second die 116. The data signal 110 can become skewed with respect to the clock signal 108 while traveling over a transmission line (not shown) coupling the signal transmission unit 102 to the signal reception unit 104. So, deskewing the clock signal 108 with respect to the data signal 110 is also useful in packaging configurations in which the signal transmission unit 102 is formed on the first die 114 and the signal reception unit 104 is formed on the second die 116.

Figure 2:
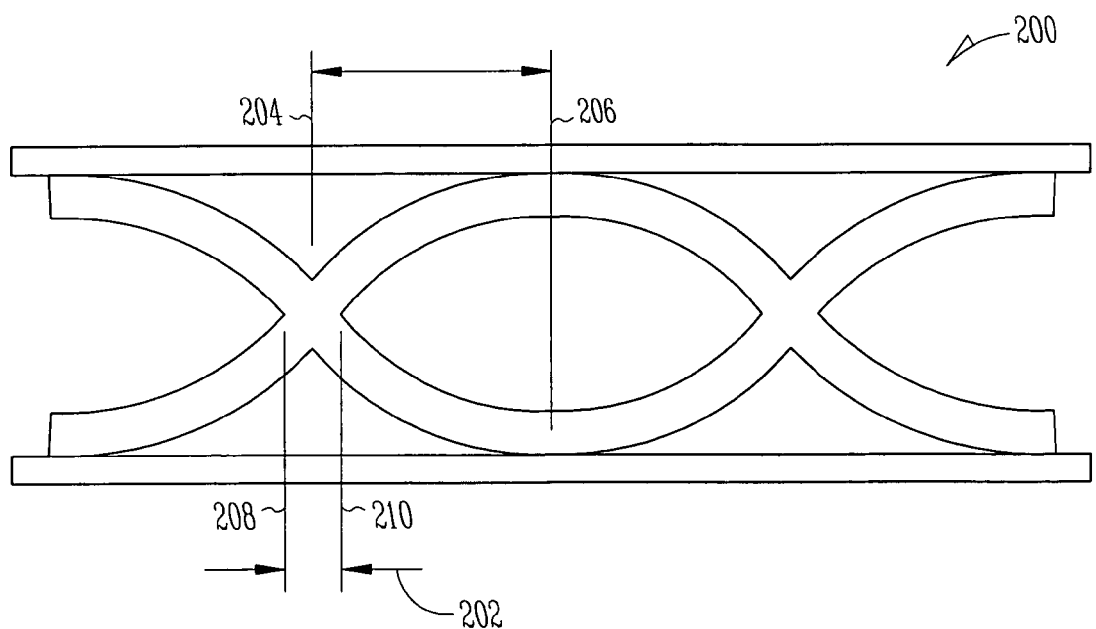
FIG. 2 shows an illustration of an eye diagram that includes a jitter range, a jitter characterization parameter, and a sampling point used in the characterization of jitter in a data signal.

FIG. 2 shows an illustration of an eye diagram 200 that includes a jitter range 202, a jitter characterization parameter 204, and a sampling point 206 used in the characterization of jitter in the data signal 110 (shown in FIGS. 1A–1C). Jitter is the deviation from the ideal timing of an event such as an edge transition in a signal. The jitter range 202 shows the variation in edge transition times between jitter range edges 208 and 210. This variation in edge transition times is sometimes represented by a distribution (not shown) of edge transitions over the jitter range 202. The jitter characterization parameter 204 represents a statistic (such as the median or mean) derived from the distribution of edge transitions. Averaging the jitter range edges 208 and 210 yields the median of the jitter range 202. A more complex calculation (described below after the description of FIG. 3C) yields the mean of the jitter range 202. The sampling point 206 is the time at which the data signal 110 (shown in FIGS. 1A–1C) represented by the eye diagram 200 is sampled. The sampling point 206 is delayed by about 90° from the jitter characterization parameter 204. The bit-error-rate (BER) of the data signal 110 at the signal reception unit 104 (shown in FIGS. 1A–1C) is improved by delaying the sampling point 206 by about 90° with respect to the mean of the jitter range 202. The BER of the data signal 110 at the signal reception unit 104 is further improved by delaying the sampling point 206 by about 90° with respect to the median of the jitter range 202.

FIG. 3A shows a block diagram of one embodiment of the clock deskew unit 101 shown in FIGS. 1A–1C. The clock deskew unit 101 includes a clock unit 302, a sampling unit 304, and a deskew control unit 306. The clock unit 302 is coupled to the sampling unit 304. The deskew control unit 306 is coupled to the clock unit 302 and the sampling unit 304.

The clock unit 302 receives the clock signal 108 and a phase control signal 310 and generates a sampling clock signal 312. The present invention is not limited to use in connection with a particular type of clock unit. In one embodiment, the clock unit 302 includes a delay-locked loop (not shown) coupled to an interpolator (not shown). The delay-locked loop receives the clock signal 108. The interpolator receives a plurality of delay-locked loop clock signals (not shown) from the delay-locked loop and the phase control signal 310 from the deskew control unit 306. The phase control signal 310 gates one of the plurality of delay-locked loop clock signals through the interpolator to generate the sampling clock signal 312.

The sampling unit 304 receives the data signal 110 and the sampling clock signal 312 and generates a sampled data signal 316. The present invention is not limited to use in connection with a particular type of sampling unit. In one embodiment, the sampling unit 304 includes a switch (not shown) coupled to a charging node of a capacitor (not shown). The charging node of the capacitor is coupled to an amplifier (not shown). The amplifier drives a flip-flop (not shown). The data signal 110 drives a data port of the switch. The sampling clock signal 312 drives a control port of the switch, and a delayed version of the sampling clock signal 312 clocks the flip-flop. An output signal of the flip-flop is the sampled data signal 316.

The deskew control unit 306 receives the sampled data signal 316 and generates the phase control signal 310. In one embodiment, the deskew control unit 306 includes the jitter characterization unit 318 and the phase control unit 320. The jitter characterization unit 318 generates the jitter characterization parameter 204 (shown in FIG. 2). The phase control unit 320 generates the phase control signal 310.

The deskew control unit 306 operates in a training mode or a data receive mode. In the training mode, the data signal 110 is a training pattern. In one embodiment, the training pattern is an alternating sequence of zeros and ones. The phase control unit 320 receives the training pattern and generates the phase control signal 310 that causes the clock signal 108 to track the data signal 110. The jitter characterization unit 318 collects edge location information for the data signal 110 during the training mode. After collecting edge location information, the jitter characterization unit 318 processes the edge location information to generate the jitter characterization parameter 204 (shown in FIG. 2).

In the data receive mode, the phase control unit 320 generates the phase control signal 310 to locate a sampling edge of the sampling clock signal 312 at the sampling point 206 (shown in FIG. 2). In one embodiment, the sampling point 206 is delayed by about 90° from the location of the jitter characterization parameter 204 (shown in FIG. 2).

FIG. 3B shows a detailed block diagram of one embodiment of the jitter characterization unit 318 shown in FIG. 3A including a jitter median calculating unit 330. The jitter characterization unit 318 accumulates and processes jitter information to generate one or more statistics that characterize the jitter in the data signal 110 (shown in FIG. 3A). The jitter median calculating unit 330 calculates the median of the accumulated jitter information. The jitter median calculating unit 330 is not limited to a particular logical design. In one embodiment, the jitter median calculating unit 330 includes an accumulator 332. In an alternative embodiment, the accumulator 332 includes a shift register 334.

FIG. 3C shows a detailed block diagram of an alternative embodiment of the jitter characterization unit 318 shown in FIG. 3A including a jitter mean calculating unit 336. The jitter mean calculating unit 336 calculates the mean of the accumulated jitter information. The jitter mean calculating unit 336 is not limited to a particular logical design. In one embodiment, the jitter mean calculating unit 336 includes a multiplier 338 coupled to the accumulator 332. In an alternative embodiment, the accumulator 332 includes the shift register 334.

Referring to FIG. 3A, in the operation of the clock deskew unit 101, one embodiment of a method for deskewing the data signal 110 includes receiving the data signal 110 and the clock signal 108, processing the data signal 110 (a test pattern such as an alternating pattern of 0s and 1s) to generate the jitter characterization parameter 204 (shown in FIG. 2), shifting the clock signal 108 by about 90° from the location of the jitter characterization parameter 204 to the sampling point 206 (shown in FIG. 2), and sampling the data signal 110 (data received in data receive mode) with the sampling clock signal 312 to generate the sampled data signal 316.

In one embodiment, processing the data signal 110 to generate the jitter characterization parameter 204 (shown in FIG. 2) includes generating a jitter median. Generating the jitter median includes aligning a clock edge of the sampling clock signal 312 to a data edge of the data signal 110 (a test pattern such as an alternating pattern of 0s and 1s), tracking the data edge with the clock edge to generate jitter information, and processing the jitter information to generate the jitter median. Aligning an edge of the sampling clock signal 312 to an edge of the data signal 110 (a test pattern such as an alternating pattern of 0s and 1s) includes initializing the phase control signal 310 to 0°, saving the value of the sampled data signal 316, and incrementing the phase control signal 310 every other clock cycle until the saved value differs from the value of the sampled data signal 316. Processing the jitter information to generate the jitter median includes identifying the two jitter range edges 208 and 210 (shown in FIG. 2) of the jitter information (shown as jitter range 202 in FIG. 2) and averaging the two jitter range edges 208 and 210 to generate the jitter median. In one embodiment, the sum of the jitter range edges 208 and 210 are stored in the accumulator 332 (shown in FIG. 3B) or the shift register 334 (shown in FIG. 3B) and shifted by one to generate the jitter median.

In an alternative embodiment, processing the data signal 110 to generate the jitter characterization parameter 204 (shown in FIG. 2) includes generating a jitter mean. Generating the jitter mean includes aligning a clock edge of the sampling clock signal 312 to a data edge of the data signal 110 (a test pattern such as an alternating pattern of 0s and 1s), tracking the data edge with the clock edge to generate jitter information having a jitter information range (shown as jitter range 202 in FIG. 2), and processing the jitter information to generate the jitter mean. Aligning an edge of the sampling clock signal 312 to an edge of the data signal 110 (a test pattern such as an alternating pattern of 0s and 1s) includes initializing the phase control signal 310 to 0°, saving the value of the sampled data signal 316, and incrementing the phase control signal 310 every other clock cycle until the saved value differs from the value of the sampled data signal 316. Processing the jitter information to generate the jitter mean includes generating $2^N$ samples for each of a plurality of phase control signal values (indexed from 1 to M, where M is an integer) within the jitter information range, processing each of the sets of $2^N$ samples, storing the results in the accumulator 332 (shown in FIG. 3C) or the shift register 334 (shown in FIG. 3C), and shifting the accumulator 332 or the shift register 334 by N places to generate the jitter mean, where N is an integer greater than or equal to 1 that determines the number of samples.

In one embodiment, processing each of the sets of $2^N$ samples includes zeroing the accumulator 332 (shown in FIG. 3C), and then for each set of $2^N$ samples counting the number of zeroes and the number of ones, selecting and storing the smaller of the number of zeroes and ones in the multiplier 338 (shown in FIG. 3C), multiplying the stored value in the multiplier by the phase control signal value index (from 1 to M) at which the samples were generated, and adding the result to the accumulator 332 or the shift register 334.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A clock deskew unit comprising:
   a clock unit to receive a clock signal and a phase control signal and generate a sampling clock signal;
   a sampling unit coupled to the clock unit, the sampling unit to receive a data signal and the sampling clock signal and generate a sampled data signal;
   a deskew control unit including a jitter characterization unit and a phase control unit, the deskew control unit coupled to the sampling unit and to the clock unit, the deskew control unit to receive the sampled data signal and generate the phase control signal; and
   wherein the phase control signal includes a jitter characterization parameter and a calculated delay parameter to adjust the sampling clock.

2. The clock deskew unit of claim 1, wherein the jitter characterization unit comprises a jitter median calculating unit.

3. The clock deskew unit of claim 2, wherein the jitter median calculating unit comprises an accumulator.

4. The clock deskew unit of claim 3, wherein the accumulator comprises a shift register.

5. The clock deskew unit of claim 1, wherein the jitter characterization unit comprises a jitter mean calculating unit.

6. The clock deskew unit of claim 5, wherein the jitter mean calculating unit comprises a multiplier coupled to an accumulator.

7. The clock deskew unit of claim 6, wherein the accumulator comprises a shift register.

8. A signaling unit comprising:
   a signal transmission unit to transmit a clock signal and a data signal; and
   a signal reception unit coupled to the signal transmission unit, the signal reception unit to receive the clock signal and the data signal, the signal reception unit including a clock deskew unit having a deskew control unit comprising:
   a jitter characterization unit; and
   a phase control unit coupled to the jitter characterization unit;
   the phase control unit to generate a phase control signal including a delay from the location of a jitter characterization parameter.

9. The signaling unit of claim 8, wherein the jitter characterization unit comprises a jitter mean generation unit.

10. The signaling unit of claim 9, wherein the signal transmission unit and the signal reception unit are formed on a single die.

11. The signaling unit of claim 8, wherein the jitter characterization unit comprises a jitter median generation unit.

12. The signaling unit of claim 11, wherein the signal transmission unit is formed on a first die and the signal reception unit is formed on a second die.

13. The signaling unit of claim 8, wherein the signal transmission unit is formed on a first die and the signal reception unit is formed in a second die.

14. A method comprising:
   receiving a data signal and a clock signal;
   processing the data signal to generate a jitter characterization parameter;
   shifting the clock signal by about 90° from the jitter characterization parameter to generate a sampling clock signal; and
   sampling the data signal with the sampling clock signal to generate a deskewed data signal.

15. The method of claim 14, wherein processing the data signal to generate a jitter characterization parameter comprises:
   generating a jitter median.

16. The method of claim 15, wherein generating a jitter median comprises:
   aligning a clock edge of the sampling clock signal to a data edge of the data signal;
   tracking the data edge with the clock edge to generate jitter information; and
   processing the jitter information to generate the jitter median.

17. The method of claim 16, wherein processing the jitter information to generate the jitter median comprises:
   identifying two jitter range edges of the jitter information; and
   averaging the two jitter range edges to generate the jitter median.

18. The method of claim 14, wherein processing the data signal to generate a jitter characterization parameter comprises:
   generating a jitter mean.

19. The method of claim 18, wherein generating a jitter mean comprises:
   aligning a clock edge of the sampling clock signal to a data edge of the data signal;
   tracking the data edge with the clock edge to generate jitter information having a jitter information range; and
   processing the jitter information to generate the jitter mean.

20. The method of claim 19, wherein processing the jitter information to generate the jitter mean comprises:
   generating 2N samples for each of a plurality phase control signal values within the jitter information range;
   processing the 2N samples and storing results in an accumulator; and
   shifting the accumulator N places to generate the jitter mean, wherein N is an integer greater than 1.

* * * * *

UNITED STATES PATENT AND TRADEMARK OFFICE
CERTIFICATE OF CORRECTION

PATENT NO. : 7,120,838 B2 Page 1 of 1
APPLICATION NO. : 10/106636
DATED : October 10, 2006
INVENTOR(S) : Casper et al.

It is certified that error appears in the above-identified patent and that said Letters Patent is hereby corrected as shown below:

In column 8, line 20, in Claim 20, delete "2N" and insert -- $2^N$ --, therefor.

In column 8, line 23, in Claim 20, delete "2N" and insert -- $2^N$ --, therefor.

Signed and Sealed this

Ninth Day of January, 2007

JON W. DUDAS
*Director of the United States Patent and Trademark Office*